US012609695B2

(12) United States Patent
Jasrotia et al.

(10) Patent No.: US 12,609,695 B2
(45) Date of Patent: Apr. 21, 2026

(54) FEEDBACK BASED SCALABLE METHOD AND SYSTEM FOR AVOIDING FAILURES DURING POWER MODE TRANSITIONS AND SUBSEQUENT WAKEUP

(71) Applicant: NXP B.V., Eindhoven (NL)

(72) Inventors: Sandeep Singh Jasrotia, Noida (IN); Christopher Micielli, Austin, TX (US); Abhishek Aggarwal, Delhi (IN); Abhinav Nawal, Noida (IN)

(73) Assignee: NXP B.V., Eindhoven (NL)

( * ) Notice: Subject to any disclaimer, the term of this patent is extended or adjusted under 35 U.S.C. 154(b) by 162 days.

(21) Appl. No.: 18/441,007

(22) Filed: Feb. 14, 2024

(65) Prior Publication Data

US 2025/0211225 A1     Jun. 26, 2025

(30) Foreign Application Priority Data

Dec. 20, 2023     (IN) .............................. 202341087300

(51) Int. Cl.
*G06F 1/00* (2006.01)
*H03K 17/56* (2006.01)
(52) U.S. Cl.
CPC ..................................... *H03K 17/56* (2013.01)
(58) Field of Classification Search
CPC ...................................................... H03K 17/56
See application file for complete search history.

(56) References Cited

U.S. PATENT DOCUMENTS

| | | | |
|---|---|---|---|
| 8,040,151 B2 | 10/2011 | Speers | |
| 11,032,768 B2 * | 6/2021 | Li | H04W 52/0225 |
| 12,231,120 B1 * | 2/2025 | Singrigowda | G06F 1/3203 |
| 2008/0136450 A1 | 6/2008 | Simmons et al. | |
| 2008/0162969 A1 | 7/2008 | Royannez et al. | |
| 2010/0156457 A1 * | 6/2010 | Greene | H03K 19/17784 |
| | | | 326/62 |
| 2014/0176336 A1 * | 6/2014 | Li | G01R 31/52 |
| | | | 340/870.01 |
| 2019/0293044 A1 * | 9/2019 | Daicho | H03K 17/0826 |
| 2020/0284830 A1 | 9/2020 | Abhishek et al. | |
| 2025/0363897 A1 * | 11/2025 | Hammond | B64U 50/37 |

* cited by examiner

*Primary Examiner* — Mohammed H Rehman

(57)     ABSTRACT

System-on-Chip (SoC) integrated circuits, methods of operating such circuits, and methods and systems for avoiding wakeup failures relating to such circuits are disclosed herein. In one example embodiment, the present disclosure relates to a SoC integrated circuit that includes core circuitry including one or more control components, and peripheral input/output (IO) circuitry including an input circuit portion, a plurality of IO pads, and a feedback generation cell, which is configured to send at least one feedback signal to be received by the one or more control components in response to a first one of one or more intermediate signals sent by the input circuit portion. The one or more control components is/are configured to send, after the one or more control components have received the at least one feedback signal, one or more input buffer enable signals to be received by the IO pads to avoid a wakeup failure.

16 Claims, 5 Drawing Sheets

FEEDBACK BASED SCALABLE METHOD AND SYSTEM FOR AVOIDING FAILURES DURING POWER MODE TRANSITIONS AND SUBSEQUENT WAKEUP

CROSS-REFERENCE TO RELATED APPLICATIONS

This application claims the priority under 35 U.S.C. § 119 of India Patent application no. 202341087300, filed on 20 Dec. 2023, the contents of which are incorporated by reference herein.

FIELD OF THE DISCLOSURE

The present disclosure relates to semiconductor devices and systems, and methods of operating same, and more particularly relates to integrated circuits such as a System-on-Chip ("SoC") integrated circuits or systems, and methods of operating such circuits or systems, in or by which such circuits or systems (or portions thereof) are turned on, activated, or woken up notwithstanding such circuits or systems (or portions thereof) previously being set to or operated in an off, depowered, low-power, or standby operational mode, status, or setting.

BACKGROUND OF THE DISCLOSURE

In many conventional low power System-on-Chip ("SoC") integrated circuit architectures, deployment of power saving schemes is not only limited to the Sea-of-Gates ("SoG") region on the SoC integrated circuit but also extends to the series or ring of input/output terminals or pads ("IORING" or "IO pads") that are typically situated along the periphery of the integrated circuit, and/or to the SoC side control circuitry or logic associated with those input/output terminals or pads (the "PAD controls").

In at least some such conventional integrated circuits, a standby mode of operation (or a low, or off, or depowered, or substantially depowered mode of operation) is achieved in which the low voltage supply of IORING's/IO pads and their associated PAD controls is switched off. Additionally, protocol-wise during the standby entry sequence, prior to initiating low voltage supply shut off, the SoC integrated circuit asynchronously resets the control logic. Because the control logic is reset followed by its supply shutting off, it is desirable that the controls inside IO pads be appropriately latched with the right operational state during standby entry.

Notwithstanding that such appropriate latching is desirable, many conventional SoC integrated circuits are susceptible of having PAD controls that become latched in incorrect states when the SoC integrated circuits enter the standby mode. This, as a consequence results in standby application failures, such as when a portion of the SoC integrated circuit remains stuck in standby when employing the IO pads as a wakeup source. SoC integrated circuits may become even more susceptible to such failures depending upon pressure (or process), volume (or voltage), and temperature (PVT) variations and/or increasing sizes of the IORING size, number of IO pads (or of the die of the integrated circuit).

FIG. 1 shows a flow chart 100 illustrating a Prior Art method (or process) of operation of a conventional SoC integrated circuit in which a standby application wakeup failure may occur. As illustrated, at a first step 102, the SoC integrated circuit (in this example) operates in a run mode of operation. Then, at a second step 104, it is determined whether entry into operation in the standby mode has been requested. If not as represented by an arrow 103, the method returns to the first step 102 and the SoC integrated circuit continues to operate in the run mode. If as represented by an arrow 105 it is determined that entry into operation in the standby mode has been requested at the step 104, then the method advances to a third step 106, at which the SoC integrated circuit achieves the standby configuration, for example, due to operation of software (SW), in regard to the SoC overall and associated input/output ("I/O" or "IO") devices. Upon achieving the standby configuration, an isolation enable is triggered at a fourth step 108 and also the SoC integrated circuit resets the IO controls and initiates the supply switch so as to have an off status at a fifth step 110.

Upon completion of the fifth step 110, the SoC integrated circuit begins operating in the standby mode as represented by a sixth step 112. In the present example, it is intended that the SoC integrated circuit should be able to be woken up, and caused to leave the standby mode, in response to a general purpose input/output ("GPIO") based wake up event that triggers such a mode change. If the SoC integrated circuit properly achieved operation in the standby mode, then particularly the controls inside the IO pads are appropriately latched with the right operational state during standby entry. In such case, if at a seventh step 114 a GPIO based wake up event occurs or is triggered, then the method advances to an eighth step 116 as represented by an arrow 115, at which time the SoC integrated circuit (or chip) initiates a standby mode exit sequence. Further, upon such sequence being completed at the eighth step 116, then the SoC integrated circuit returns to the first step 102 as represented by an arrow 117, at which the SoC integrated circuit again operates in run mode. Such a sequence of operations in response to the occurrence of a wakeup event (and particularly the return from standby mode to run mode) may be considered a normal sequence of operations.

However, if one or more of the IO pads have not been appropriately latched when the SoC integrated circuit enters the standby mode, then it is possible that a GPIO based wake up event that occurs (at the seventh step 114) will not trigger an exit from the standby mode of operation, but rather the method will return to or remain in the sixth step 112 as represented by an arrow 119. In such case, the SoC integrated circuit will remain at, or stuck in, the standby mode of operation, and will have experienced a wakeup failure as represented by a star 118. Further, as represented by a dashed box 120, if the SoC integrated circuit has latches that are not appropriately latched when entering the standby mode, the SoC integrated circuit may possibly remain caught within an endless loop notwithstanding the occurrence of repeated GPIO based wake up events.

For at least one or more reasons, it would be advantageous if new or improved System-on-Chip ("SoC") integrated circuits or systems (or other semiconductor devices and systems) and methods of operating such circuits or systems (or portions thereof) could be developed to address one or more of the concerns described above relating to wakeup failures, or to address one or more other concerns, or to provide one or more benefits.

BRIEF DESCRIPTION OF THE DRAWINGS

FIG. 4 is a schematic diagram illustrating portions of an improved SoC integrated circuit in accordance with a first example embodiment encompassed herein, in regard to which closed loop feedback is implemented;

FIG. 5 is a timing diagram illustrating an improved manner of operation of the improved SoC integrated circuit of FIG. 4 by which the improved SoC integrated circuit avoids wakeup failures through the implementation of the closed loop feedback;

DETAILED DESCRIPTION

The present inventors have recognized that wakeup failures may particularly occur during operation of a conventional SoC integrated circuit, such that the SoC integrated circuit is stuck in a standby mode, when using IO pads of the SoC integrated circuit as a wakeup source. The present inventors have additionally recognized that such wakeup failures may particularly occur with respect to general purpose input/output pads (GPIOs) that are positioned beyond a certain distance from a first input cell (e.g., a "spacer abutment" cell) that receives control signals from the internal control circuitry of the SoC integrated circuit.

In this regard, the present inventors have particularly recognized that, if the physical routing length of latch enable signals increases beyond a threshold level (which may depend upon the embodiment), such latch enable signals may become delayed to such an extent that there arise violations in the timing between input buffer enable signals ("IBEs") and latch control (or enable) signals. That is, in some operational circumstances of such a conventional SoC integrated circuit, input buffer enable signals ("IBEs") consistent with a standby mode or low power (or an off, or depowered, or substantially depowered) mode of operation of the SoC integrated circuit switch from high to low with respect to all of the GPIOs before one or more of the GPIOs receive latch control (or enable) signals that would cause those GPIOs to become configured into an input mode. Consequently, one of more of the GPIOs fail to become configured into the input mode when the SoC integrated circuit enters into standby mode and those GPIOs are then unable to respond to, or provide to the SoC integrated circuit, wakeup signals received from outside sources that would (during proper operation) wakeup the SoC integrated circuit and cause it to exit the standby mode.

Figure 2:
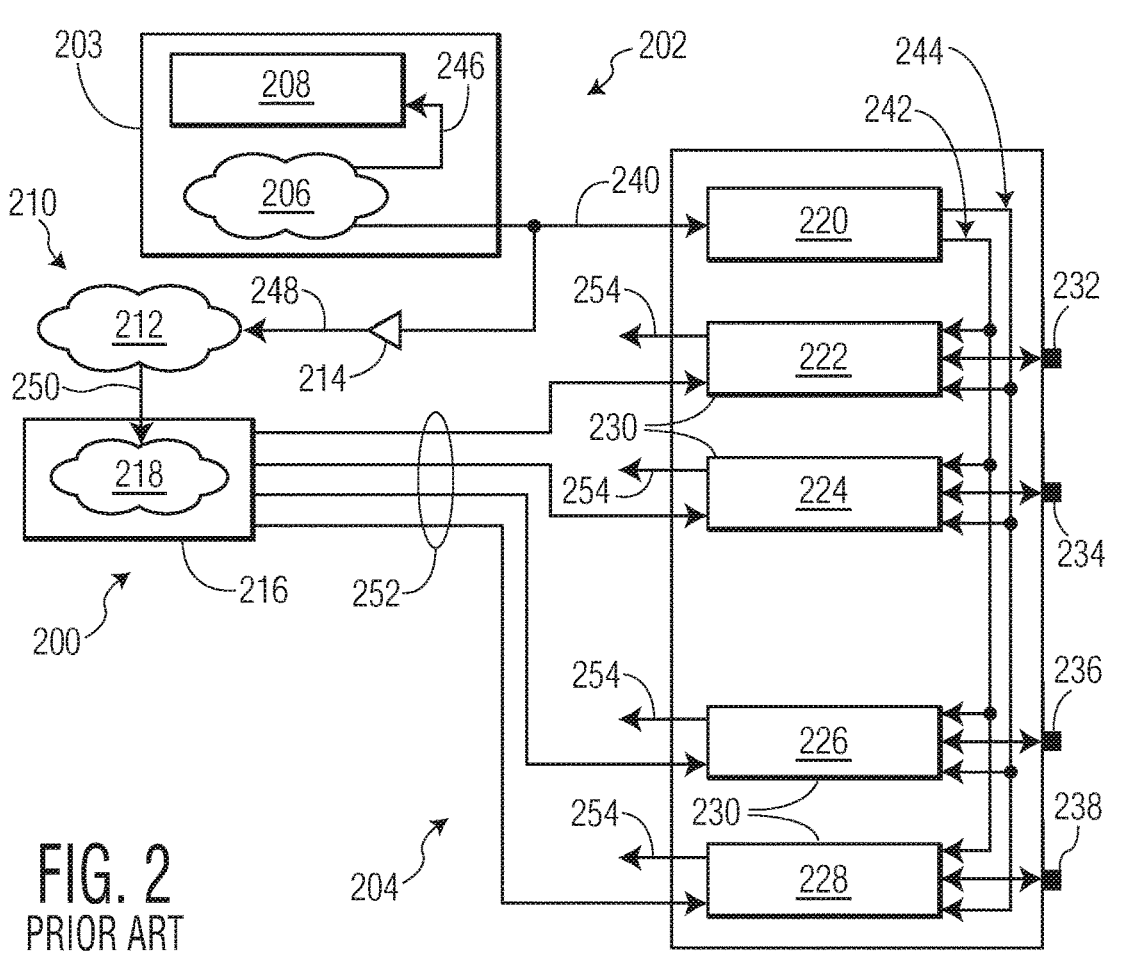
FIG. 2 is a schematic diagram illustrating portions of a Prior Art or conventional SoC integrated circuit that may experience wakeup failures as described in regard to FIG. 1.
Figure 3:
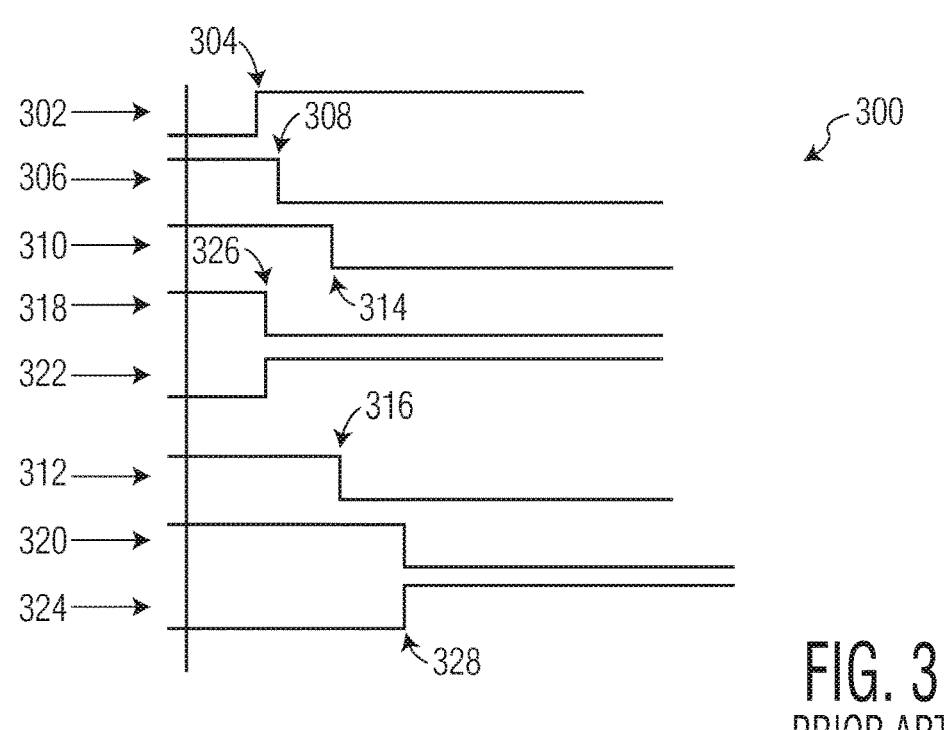
FIG. 3 is a timing diagram illustrating a Prior Art manner of operation of the portions of the conventional SoC integrated circuit of FIG. 2 that may result in wakeup failures.

FIG. 2 and FIG. 3 illustrate in more detail these aspects associated with the operation of conventional SoC integrated circuits that may result in wakeup failures as described above. FIG. 2 is a schematic diagram illustrating portions of a conventional or Prior Art SoC integrated circuit 200. As shown, the SoC integrated circuit 200 particularly includes core circuitry 202 and IORING circuitry 204. The core circuitry 202 may also be referred to as SoC circuitry or SoC logic (or simply the "SoC" portion of the SoC integrated circuit 200), and the IORING circuitry 204 may also be referred to as peripheral input/output (I/O or IO) circuitry or simply as peripheral circuitry. The core circuitry 202 includes a primary control block 203 having a power control unit (PCU) 206 and a power management control circuit (PMC) 208, each of which includes digital logic that is (or includes) an always on (AON) core domain. Also, the core circuitry 202 further includes additional circuitry 210 that includes each of an asynchronous reset block 212, a fixed delay component 214, and a switchable domain unit 216 including a SoC logic unit (or IO control unit) 218. The switchable domain unit 216 is or includes a switchable core domain that may be powered off during the low-power standby mode (and may also be referred to by terms such as VDD_SW or VDD_SWITCHED). The IORING circuitry 204 includes a first input cell 220, which may also be referred to as a spacer abutment ("SPCR ABT") cell or more simply as a spacer ("SPCR") cell.

Additionally, the IORING circuitry 204 also includes a plurality of IO pads 230, which in this example embodiment include each of a first IO pad (IO pad #1) 222, a second IO pad (IO pad #2) 224, a penultimate IO pad (IO pad #N−1) 226, and a final IO pad (IO pad #N) 228. The first, second, penultimate, and final IO pads 222, 224, 226, and 228 respectively include, or are coupled to, a first pin 232, a second pin 234, a penultimate pin 236, and final pin 238, respectively (respectively, Pin #1, Pin #2, Pin #N−1 and Pin #N), each of which may potentially be coupled to, and receive respective signals from, one or more external devices (not shown).

FIG. 2 further illustrates various signals that are communicated within, and/or received by, the conventional SoC integrated circuit 200 when the SoC integrated circuit operates to enter standby mode and yet also is configured so that the SoC integrated circuit may be awoken from the standby mode in response to an appropriate signal received from an external source at one of the IO pads 230. As illustrated, when entering standby mode, the PCU 206 issues a standby signal 240 (ipp_close_lv) for receipt by the first input cell 220 and also the fixed delay component 214. In response to receiving the standby signal 240, which is a low voltage signal (e.g., 800 milliVolt), the first input cell 220 sends a first plurality of high voltage (e.g., 3.3 Volt) IO pad signals 242 respectively for receipt by each of the IO pads 222, 224, 226, and 228, respectively (abt_close_nor_rst_mv #1, #2, #N−1, and #N, respectively), and also sends a second plurality of high voltage IO pad signals 244 respectively for receipt by each of the IO pads 222, 224, 226, and 228, respectively (abt_close_and_rstb_mv #1, #2, #N−1, and #N, respectively). The high voltage IO pad signals 242 and 244 are latch control (or latch enable) signals, which particularly enable latching of low voltage GPIO controls (IBE/OBE/PUE/PUS etc.) in the high voltage domain.

Additionally, when entering standby mode, the PCU 206 issues a request signal 246 for receipt by the PMC 208. Further, in response to receiving the standby signal 240, the fixed delay component 214 outputs a delayed standby signal 248, which is delayed temporally relative to the standby signal 240, for receipt by the asynchronous reset block 212. The asynchronous reset block 212 in turn transmits a control signal 250 for receipt by the SoC logic 218 of the switchable domain unit 216. In response, the switchable domain unit 216 sends a plurality of input buffer enable signals 252 respectively for receipt by each of the IO pads 222, 224, 226, and 228, respectively (ipp_ibe_lv #1, #2, #N−1, and #N, respectively). Also assuming that the IO pads 222, 224, 226, and 228 are latched so as to remain on even though the SoC integrated circuit 200 overall (and particularly the core circuitry 202 thereof) enters the standby mode, then any respective input signal received at the respective IO pads 222, 224, 226, and 228 via the respective pins 232, 234, 236, and 238 is communicated as, or precipitates the sending of, a respective wakeup signal 254 (ipp_ind_lv #1, #2, #N−1, and #N, respectively) for receipt by the core circuitry 202.

Referring additionally to FIG. 3, a source of wakeup failures that may occur when the conventional or Prior Art SoC integrated circuit 200 enters the standby mode is illustrated by a timing diagram 300. The timing diagram 300 particularly shows a standby signal 302, which may be an example of the standby signal (ipp_close_lv) 240, and which is shown to switch from a low value to a high value at a first time 304. Also, the timing diagram 300 shows an asynchronous reset signal 306, which may be an example of the control signal 250, and which is shown to switch from a high value to a low value at a second time 308 subsequent to the first time. The delay between the first time 304 and the second time 308 may be attributed to operation of the fixed delay component 214. Additionally, the timing diagram 300 also shows first and second input buffer enable signals 310 and 312, respectively, which in this example are examples of the input buffer enable signals 252 that are sent for receipt by the first IO pad 222 and the penultimate IO pad 226 (ipp_ibe_lv #1 and #N−1, respectively), and which respectively switch from a high level to a low level at a third time 314 and a fourth time 316, respectively, both of which are subsequent to the second time 308.

Further, the timing diagram 300 also shows first, second, third, and fourth IO pad signals 318, 320, 322, and 324, respectively. The first and second IO pad signals 318 and 320, respectively, may be considered to be those ones of the first plurality of IO pad signals 242 that are respectively provided for receipt by the first IO pad 222 and the penultimate IO pad 226, respectively (that is, the abt_close_nor_rst_mv #1 and #N−1 signals, respectively). The third and fourth IO pad signals 322 and 324, respectively, may be considered to be those ones of the second plurality of IO pad signals 244 that are respectively provided for receipt by the first IO pad 222 and the penultimate IO pad 226, respectively (that is, the abt_close_and_rstb_mv #1 and #N−1, respectively). In the present example of FIG. 3, it may be seen that the first IO pad signal 318 switches from a high level to a low level, and that the third IO pad signal 322 switches from a low level to a high level, at a fifth time 326. Further, it may be seen that the second IO pad signal 320 switches from a high level to a low level, and that the fourth IO pad signal 324 switches from a low level to a high level, at a sixth time 328.

A source of wakeup failure is evident from the timing diagram 300. In this example, the fifth time 326, at which the first IO pad signal 318 switches from the high level to the low level (and the second IO pad signal 320 switches from the low level to the high level) occurs prior to the third time 314, at which the first input buffer enable signal 310 switches from the high level to the low level. Consequently, the first IO pad 222 is latched at a high level when the SoC integrated circuit 200 enters the standby mode, since the first input buffer enable signal 310 is at a high level when the fifth time 326 occurs such that the first IO pad signal 318 and second IO pad signal 320 switch. Given this to be the case (in which the first IO pad 222 is latched at a correct, high value), even though the core circuitry 202 enters the standby mode, the first IO pad 222 is properly set to be able to receive input signal(s) from external source(s) at the first pin 232 and transmit or pass those input signal(s) (or signal(s) based thereon) to the core circuitry in the form of one of the wakeup signals 254 (ipp_ind_lv #1).

However, in this example, the sixth time 328, at which the third IO pad signal 322 switches from the high level to the low level (and the fourth IO pad signal 324 switches from the low level to the high level) occurs subsequent to the fourth time 316, at which the second input buffer enable signal 312 switches from the high level to the low level. Consequently, the penultimate IO pad 226 is latched at a low level when the SoC integrated circuit 200 enters the standby mode, since the second input buffer enable signal 312 is at a low level when the sixth time 328 occurs such that the third IO pad signal 322 and fourth IO pad signal 324 switch. Given this to be the case, when though the core circuitry 202 enters the standby mode, the penultimate IO pad 226 is not properly set to be able to receive input signal(s) from external source(s) at the penultimate pin 236 and transmit those input signal(s) (or signal(s) based thereon) to the core circuitry in the form of one of the wakeup signals 254 (ipp_ind_lv #N−1). To the contrary, in this circumstance (because, in this failure case, the penultimate IO pad is latched at an incorrect, low value), input signal(s) received at the penultimate pin 236 from external source(s) are not properly transmitted as wakeup signals to wake up the core circuitry 202 (and the SoC integrated circuit 200 overall) from the standby mode, and consequently wakeup failure(s) occur.

In regard to wakeup failures such as those described in regard to FIG. 2 and FIG. 3, the present inventors have additionally recognized that it may be the GPIO that is (or GPIOs that are) positioned physically farthest from the SPCR cell that may experience the worst delay (or worst delays) in terms of the receipt by the GPIO (or GPIOs) of latch control signal(s) and in regard to which wakeup failures may occur. This is because the physical routing length for communication of the latch control (or latch enable) signals (e.g., the high voltage IO pad signals 242 and 244) increases and, beyond certain threshold distance(s), these latch control signals become delayed by such an extent that timing violations occur between those latch control signals and the times at which the input buffer enable signals (e.g., the input buffer enable signals 252) switch from being high to being low. That is, the input buffer enable signals may switch low before arrival of the latch control signal(s) at certain one(s) of the GPIO(s)), and hence one or more of (or a set of) the GPIO(s) do not become configured in input mode during standby entry. It is these GPIO(s) that in turn fail to appropriately communicate wakeup signals to the SoC integrated circuit 200 (and particularly the core circuitry 202 thereof) when the SoC integrated circuit is in standby mode.

Additionally, the present inventors have also recognized that the input buffer enable signals (e.g., the input buffer enable signals 252) from the SoC side (from the core circuitry 202 side) depending on routing/buffering may also have different delays while reaching (until responsive)

GPIOs—some faster and some slower. Further, the present inventors have additionally recognized that these concerns about signal delays, timing violations, and wakeup failures also are susceptible to variation (and may become worse) due to process manufacturing variability, tolerances (e.g., voltage signal variations on the order of +/–10%), and temperature (typically, signal delays may become larger as temperatures become hotter, and signal delays may become shorter as temperature become cooler). In view of the above considerations, the present inventors have further recognized that at least some conventional SoC integrated circuits experience wakeup failures that are attributable to architectural considerations such as the physical spacing of various ones of the GPIOs relative to the SoC core circuitry, and such problems are spread across (or due to the physical spacing among) the SoC core circuitry (or SoC side) and the IORING, due to the highly timing dependent nature of the signals involved.

With one or more of these considerations and/or other considerations in mind, the present inventors have additionally recognized that one or more of such concerns associated with wakeup failures in SoC integrated circuits may be addressed or resolved by implementing closed loop feedback within the SoC integrated circuits, as described in and encompassed by the present disclosure. In particular, the present inventors have recognized that closed loop feedback (or handshake operation) between the core circuitry of the SoC integrated circuit and the IORING circuitry of the SoC integrated circuit may operate to ensure that input buffer enable signals (IBEs) are first latched inside IO pads before getting reset. As described in further detail below, in some embodiments encompassed herein, such closed loop feedback (or handshake operation) is achieved by a special state machine on the SoC (or core circuitry) side (PCU) and latch acknowledge generation (ACK gen) cell on the IORING side. A latching signal is (or multiple latching signals are) passed around the IORING side and then a latch acknowledge generation (or latch acknowledge) signal is fed back and used in the core circuitry of the SoC as a basis for determining that it is an appropriate time to enter the low-power standby mode of operation.

More particularly, in some such embodiments, a latch acknowledge generation cell on the IORING side operates particularly to generate feedback (or handshake) signals for receipt by the PCU (logic of the SoC side or core circuitry). The PCU is configured to accept such feedback signaling from the IORING side (e.g., from one or more than one latch acknowledge generation cell(s)) and, upon receiving such feedback signaling, to send input enable signal(s) to gate reset the IO pads (or GPIO or PD1 domain) of the IORING side. However, as long as the PCU (SoC logic) does not receive an appropriate feedback signal from the latch acknowledge generation cell, the PCU refrains from communicating any input buffer enable signals that would reset the IO pad (or GPIO or PD1 domain) configuration. Further, the latch acknowledge generation is particularly configured to generate the feedback (or handshake) signals in response to IO pad signals communicated by a spacer (SPCR or SPCR abt) cell, which in turn generates those IO pad signals in response to receiving a standby signal from the PCU. The latch acknowledge generation cell is positioned farther away from the spacer cell than any IO pads of the IORING side (e.g., the latch acknowledge generation cell is positioned next to the GPIO that is farthest from the spacer cell). Given this arrangement, IO pad settings (or the GPIO configurations) are not altered (or lost) due to input enable signals from the SoC side (that is, the GPIO configurations are not reset by the PCU) until the farthest-positioned GPIO (and thus all of the GPIOs) of the IORING side has (and have) received IO pad signals in response to the sending of the standby signal from the PCU (serving as the time latch control).

Figures 4, 5:
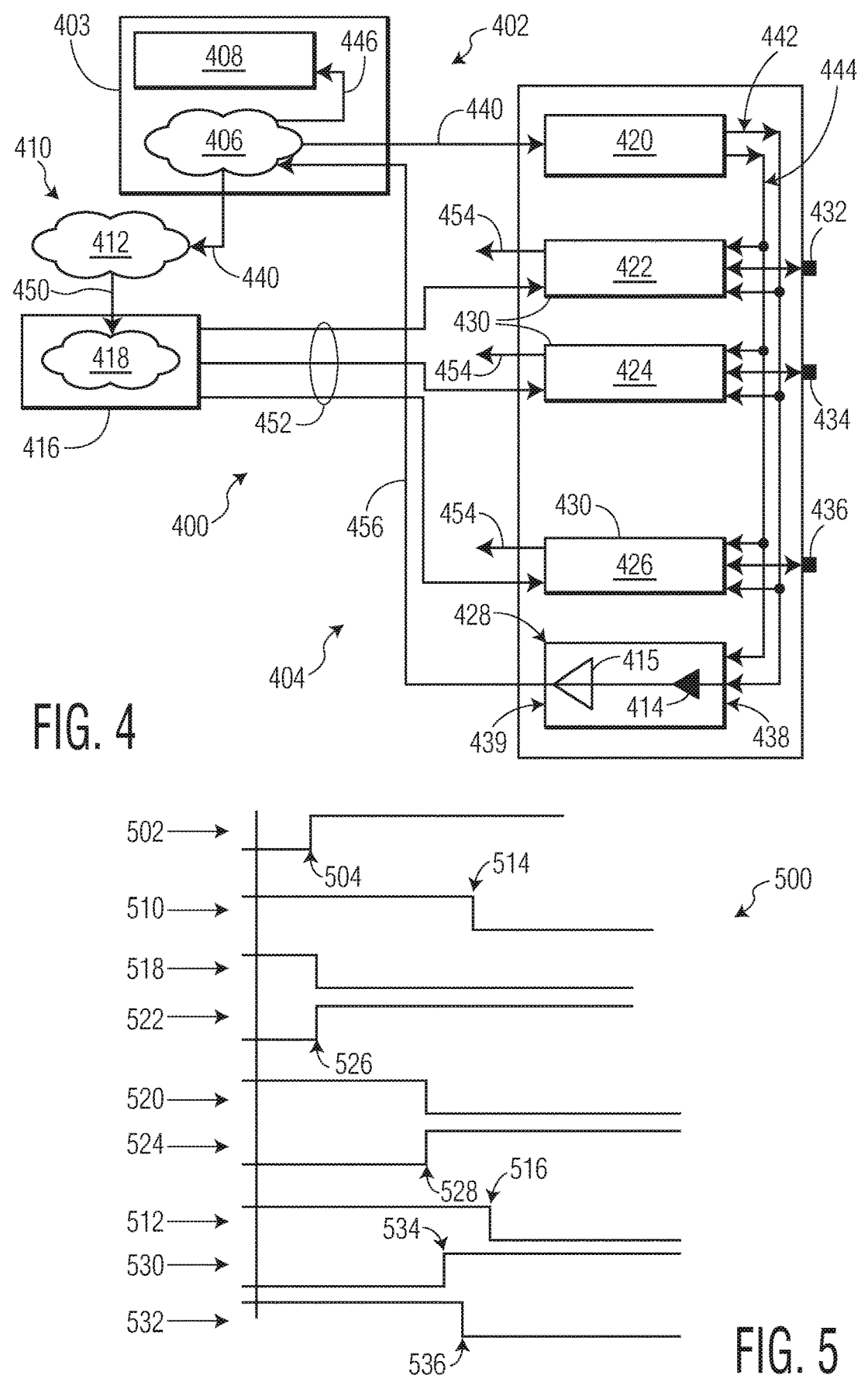

Referring now to FIG. 4, a schematic diagram is provided that illustrates portions of an improved SoC integrated circuit 400 in accordance with an example embodiment encompassed herein, in regard to which closed loop feedback is implemented. As shown, the improved SoC integrated circuit 400 particularly includes core circuitry 402 and IORING circuitry 404. The core circuitry 402 may also be referred to as SoC circuitry or SoC logic (or simply the "SoC" portion of the SoC integrated circuit 400), and the IORING circuitry 404 may also be referred to as peripheral input/output (I/O) circuitry or simply as peripheral circuitry. The core circuitry 402 includes a primary control block 403 having a power control unit (PCU) 406 and a power management control circuit (PMC) 408, each of which includes digital logic (always on (AON) domain). Also, the core circuitry 402 further includes additional circuitry 410 that includes each of an asynchronous reset block 412 and a switchable domain unit 416 including a SoC logic unit (or IO control unit) 418. It will be appreciated, from a comparison of the improved SoC integrated circuit 400 of FIG. 4 relative to the SoC integrated circuit 200 of FIG. 2, that the improved SoC integrated circuit 400 does not in the present embodiment employ any fixed delay component between the asynchronous reset block 412 and the PCU 406 corresponding to the fixed delay component 214 of the SoC integrated circuit 200.

Additionally as shown, the IORING circuitry 404 of the improved SoC integrated circuit 400 includes a first input or spacer (SPCR) cell 420 (which also may be referred to as a spacer abutment or "SPCR ABT" cell) and a plurality of IO pads 430, which in this example embodiment include each of a first IO pad (IO pad #1) 422, a second IO pad (IO pad #2) 424, and a final IO pad (IO pad #N) 426. The first, second, and final IO pads 422, 424, and 426 respectively include, or are coupled to, a first pin 432, a second pin 434, and a final pin 436, respectively (respectively, Pin #1, Pin #2, and Pin #N), each of which may potentially be coupled to, and receive respective signals from, one or more external devices (not shown). It should be appreciated that, although the plurality of IO pads 430 is shown to include three of the IO pads (that is, the first, second, and final IO pads 422, 424, and 426) in the illustration of FIG. 4, the present disclosure is intended to encompass embodiments of SoC integrated circuits that have any arbitrary number of IO pads, including more than (or less than) three IO pads. Correspondingly, any arbitrary number of pins coupled to the IO pads may be present depending upon the embodiment.

Figure 1:
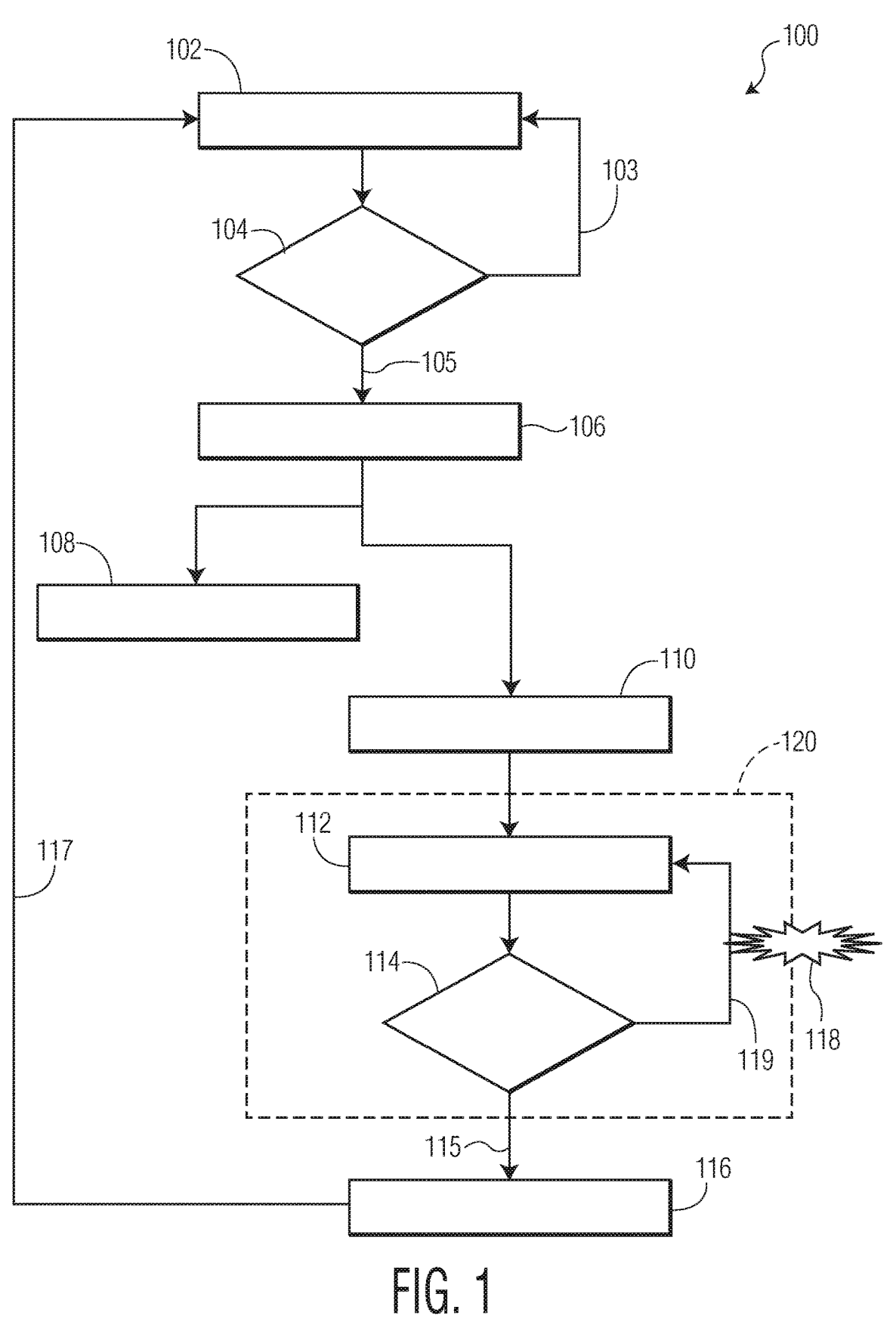
FIG. 1 is a flow chart illustrating a Prior Art method (or process) of operation of a conventional SoC integrated circuit in which a standby application wakeup failure may occur.

In contrast to the IORING circuitry 204 of the SoC integrated circuit 200 of FIG. 2, the IORING circuitry 404 of the improved SoC integrated circuit 400 additionally includes a latch acknowledge generation (ACK gen) cell 428. The latch acknowledge generation cell 428 includes a first buffer 414 connected in series with a high-to-low level shifter 415 between an input terminal 438 and an output terminal 439. In the present embodiment, it should additionally be recognized from FIG. 1 that each of the successive ones of the IO pads of the plurality of IO pads 430 are physically positioned successively farther from the SPCR cell 420, in a series. Thus, in the present example, the first IO pad 422 is closer to the SPCR cell 420 than the second IO pad 424, and the second IO pad is closer to the SPCR cell than the final IO pad 426. Further, the latch acknowledge generation cell 428 is positioned at the end of the series of the plurality of IO pads 430, physically positioned farther from the SPCR cell 420 than any of the IO pads and particularly farther from the SPCR cell than the final IO pad 426.

FIG. 4 further illustrates various signals that are communicated within, and/or received by, the improved SoC integrated circuit 400 when the SoC integrated circuit operates to enter standby mode and yet also is configured so that the SoC integrated circuit may be awoken from the standby mode in response to an appropriate signal received from an external source at one of the IO pads 430. As illustrated, when entering standby mode, the PCU 406 issues a standby signal 440 for receipt by the SPCR cell 420 and also the asynchronous reset block 412 (as noted previously, in the present embodiment, there is no fixed delay component between the asynchronous reset block and the PCU). The standby signal 440 may also be referred to as a latching signal, latch control signal, or latch enable signals (and for example may be referred to by terms such as ipp_close_lv or latch_enable_lv) Although the standby signal 440 is sent both to the SPCR cell 420 and also to the asynchronous reset block 412 in the present embodiment, in alternate embodiments, the signal sent from the PCU to the asynchronous reset block 412 may be different from the signal sent as the standby signal from the PCU to the SPCR cell 420. Further in the present embodiment, when entering standby mode, the PCU 406 issues a request signal 446 for receipt by the PMC 408.

In response to receiving the standby signal 440, which is a low voltage signal (e.g., 800 milliVolt), the SPCR cell 420 sends a first plurality of high voltage (e.g., 3.3 Volt) IO pad signals 442 respectively for receipt by each of the IO pads 422, 424, and 426, respectively (abt_close_nor_rst_mv #1, #2, and #N, respectively), as well as additionally by the latch acknowledge generation cell 428. Additionally in response to receiving the standby signal 440, the SPCR cell 420 also sends a second plurality of high voltage IO pad signals 444 respectively for receipt by each of the IO pads 422, 424, and 426, respectively (abt_close_and_rstb_mv #1, #2, and #N, respectively), as well as additionally by the latch acknowledge generation cell 428. In generating the high voltage IO pad signals 442 and 444, the SPCR cell 420 operates to provide level shifting, from the low voltage standby signal 440 to the high voltage IO pad signals 442 and 444. Also, the SPCR cell 420 includes and operates in accordance with additional logic by which the SPCR cell splits the low voltage standby signal 440 into the two different pluralities of high voltage IO pad signals 442 and 444.

Given that the high voltage IO pad signals 442 and 444 are based upon or occur in response to the standby signal 440 (which as noted above may also be referred to as a latching signal, latch control signal, or latch enable signal), the high voltage IO pad signals 442 and 444 also may be considered or referred to as latching signals, latch control signals, or latch enable signals that are passed around the IORING circuitry 404. The high voltage IO pad signals 442 and 444 particularly enable latching of low voltage GPIO controls or IO control signals in the high voltage domain. The low voltage GPIO controls or IO control signals that may be latched may include, for example, any one or more of (or all of) a variety of IO pad enable/control signals that may be associated with IO pads, etc. Such IO pad enable/control signals may include, further for example, input buffer enable (IBE) signals as may be associated with input buffers of IO pads, output buffer enable (OBE) signals as may be associated with output buffers of IO pads, pull-upenable (PUE) signals as may be associated with weakpull up/down circuits of IO pads, and/or pull-up-select (PUS) signals as may be associated with weakpull up/down circuits of IO pads, etc. The latching of these low voltage GPIO controls or IO control signals properly may be achieved before standby entry (before entering standby mode of operation), for cleaner standby entry.

It should be understood that, to simplify the illustration of the IO pad signals 442 and 444 in FIG. 4, the IO pad signals 442 are illustrated as being provided to each of the successive ones of the IO pads 422, 424, and 426 and also to the latch acknowledge generation cell 428 in succession, with the respective IO pads and latch acknowledge generation cell being sequentially coupled in series with one another. Likewise, the IO pad signals 444 are illustrated as being provided to each of the successive ones of the IO pads 422, 424, and 426 and also to the latch acknowledge generation cell 428 in succession, with the respective IO pads and latch acknowledge generation cell being sequentially coupled in series with one another. Illustrated in this manner, the IO pad signals 442 may be understood as including a single signal that is provided sequentially as multiple signals to the first IO pad 422, then to the second IO pad, and then to the final IO pad (with the signal also being provided to any additional IO pads positioned in between the second and final IO pads), and ultimately to the latch acknowledge generation cell 428. When communicated in this manner, the IO pad signals 442 may be understood as encompassing a plurality of signals, where the respective signals are respective individual signals that are communicated from a preceding node to a subsequent node (e.g., from the SPCR cell 420 to the first IO pad 422, from the first IO pad to the second IO pad 424, from the second IO pad to the final IO pad 426, and then from the final IO pad 426 to the latch acknowledge generation cell 428. In substantially the same manner, the IO pad signals 444 may be understood as including a plurality of signals that are respectively communicated sequentially as multiple signals to the first IO pad 422, then to the second IO pad 424, and then to the final IO pad 426 (with the signal also being provided to any additional IO pads positioned in between the second and final IO pads), and ultimately to the latch acknowledge generation cell 428.

Notwithstanding this being the case, it is also intended that FIG. 4 may be representative of embodiments in which the IO pad signals 442 and 444 take other forms or are communicated in other manners. For example, in some other embodiments, the IO pad signals 442 may include first, second, third, and fourth signals that are sent in parallel with one another from the SPCR 420 to the first IO pad 422, second IO pad 424, final IO pad 426, and latch acknowledge generation cell 428, respectively, by way of respective discrete signal paths/connections (and, if additional IO pads are present, there may be further distinct ones of the IO pad signals 442 that are routed to those respective IO pads as well). Likewise, in some other embodiments, the IO pad signals 444 may include first, second, third, and fourth signals that are sent in parallel with one another from the SPCR 420 to the first IO pad 422, second IO pad 424, final IO pad 426, and latch acknowledge generation cell 428, respectively, by way of respective discrete signal paths/connections (and, if additional IO pads are present, there may be further distinct ones of the IO pad signals 444). Additionally, notwithstanding the above description in which there are both the IO pad signals 442 and also the IO pad signals 444, the present disclosure is also intended to encompass embodiments in which there are one or the other, but not both, of the IO pad signals 442 and the IO pad signals

444. For example, the IO pad design in at least some embodiments encompassed herein is such that only a single latching signal (e.g., corresponding to the abt_close_an-d_rstb_mv signal) is used or transmitted between the SPCR cell 420 and the IO pads such as the IO pads 422, 424, and 426 (and/or any other IO pads that may be present).

In the above-described embodiments, regardless of whether the IO pad signals 442 and IO pad signals 444 take forms that involve the sequential communication of signals to the IO pads 422, 424, and 426 (and/or additional IO pads) and the latch acknowledge generation cell 428 when those IO pads and latch acknowledge generation cell are series-connected, or whether those IO pad signals 442 and 444 each include respective pluralities of signals that are transmitted in a parallel manner to the various IO pads and latch acknowledge generation cell, in any of these circumstances the signal path between the SPCR cell and the latch acknowledge generation cell will be physically greater than each of the signal paths linking the SPCR cell and each of the IO pads, so that the ones of the IO pad signals 442 and 444 that reach of the latch acknowledge generation call take longer times to arrive at the latch acknowledge generation cell than do those of the IO pad signals 442 and 444 that are communicated to the IO pads 422, 424, and 426 (and/or any other IO pads).

Further, in response to receiving the standby signal 440, the asynchronous reset block 412 in turn transmits a control signal (or asynchronous reset signal) 450 for receipt by the SoC logic 418 of the switchable domain unit 216. In response, the switchable domain unit 416 sends a plurality of input buffer enable (IBE) signals 452 respectively for receipt by each of the IO pads 422, 424, and 426, respectively (ipp_ibe_lv #1, #2, and #N, respectively). Also assuming that the IO pads 422, 424, and 426 are latched so as to remain on even though the improved SoC integrated circuit 400 overall (and particularly the core circuitry 402 thereof) enters the standby mode, then any respective input signal received at the respective IO pads 422, 424, and 426 via the respective pins 432, 434, and 436 is communicated as, or precipitates the sending of, a respective wakeup signal 454 (ipp_ind_lv #1, #2, and #N, respectively) for receipt by the core circuitry 402 (although not shown in FIG. 4 to be coupled to the PCU or other portions of the core circuitry to simplify the illustration provided, it should be appreciated that the respective wakeup signals 454 would be communicated at least indirectly to the PCU or other portions of the core circuitry during operation).

Additionally, in the present example embodiment, in response to the latch acknowledge generation cell 428 receiving one of the each of the high voltage IO pad signals 442 and the high voltage IO pad signals 444 at the input terminal 438, the latch acknowledge generation outputs at the output terminal 439 an acknowledgement signal 456 that is communicated back to the PCU 406. The acknowledgement signal 456 constitutes a feedback signal that indicates one of the IO pad signals 442 and one of the IO pad signals 444 have been received at the latch acknowledge generation cell 428 in response to the sending of the standby signal 440 by the PCU to the SPCR cell 420. The acknowledgement signal 456 may also be considered a signal that serves a handshaking purpose at the PCU 406.

Additionally, referring to FIG. 5, a timing diagram 500 is provided that illustrates how the improved SoC integrated circuit 400 may avoid wakeup failures through the implementation of the closed loop feedback. The timing diagram 500 particularly shows a standby signal 502, which may be an example of the standby signal (ipp_close_lv or latch_ enable_lv) 440, and which is shown to switch from a low value to a high value at a first time 504. Additionally, the timing diagram 500 also shows first and second input buffer enable signals 510 and 512, respectively, which in this example are examples of the input buffer enable signals 452 that are sent for receipt by the first IO pad 422 and the final IO pad 426 (ipp_ibe_lv #1 and #N, respectively), and which respectively switch from a high level to a low level at a second time 514 and a third time 516, respectively, both of which are subsequent to the first time 504.

Further, the timing diagram 500 also shows first, second, third, and fourth IO pad signals 518, 520, 522, and 524, respectively. The first and second IO pad signals 518 and 520, respectively, may be considered to be those ones of the first plurality of IO pad signals 442 that are respectively provided for receipt by the first IO pad 422 and the final IO pad 426, respectively (that is, the abt_close_nor_rst_mv #1 and #N signals, respectively). The third and fourth IO pad signals 522 and 524, respectively, may be considered to be those ones of the second plurality of IO pad signals 444 that are respectively provided for receipt by the first IO pad 422 and the final IO pad 426, respectively (that is, the abt_close_and_rstb_mv #1 and #N, respectively). In the present example of FIG. 5, it may be seen that the first IO pad signal 518 switches from a high level to a low level, and that the third IO pad signal 522 switches from a low level to a high level, at a fourth time 526. Further, it may be seen that the second IO pad signal 520 switches from a high level to a low level, and that the fourth IO pad signal 524 switches from a low level to a high level, at a fifth time 528.

In addition, the timing diagram 500 also shows a latch acknowledgement signal 530 that may be considered an example of the latch acknowledgement signal 456 output by the latch acknowledge generation cell 428, as well as a control signal (or asynchronous reset signal) 532 that may be considered an example of the control signal (or asynchronous reset signal) 450. As shown, the latch acknowledgement signal 530 in the present example switches from a low level to a high level at a sixth time 534, and the control signal 532 switches from a high level to a low level at a seventh time 536 subsequent to the sixth time 534. It will be appreciated from the above discussion that the latch acknowledgement signal 530 is generated by the latch acknowledge generation cell 428 in response to ones of the IO pad signals 442, 444 that are sent by the SPCR cell 420 and received by the latch acknowledge generation cell. Because the latch acknowledge generation cell 428 is physically farther from the SPCR cell 420 than any of the IO pads of the plurality of IO pads 430, the IO pad signals that are directed to the latch acknowledge generation cell 428 arrive at the latch acknowledge generation cell at time(s) that are later than when any of the IO pad signals are received at any of the IO pads 430. Consequently, the sixth time 534 at which the latch acknowledgement signal 530 switches from the low level to the high level occurs after each of the fourth time 526 at which the first IO pad signal 518 switches from the high level to the low level (and at which the third IO pad signal 522 switches from the low level to the high level) and the fifth time 528 at which the second IO pad signal 520 switches from the high level to the low level (and at which the fourth IO pad signal 524 switches from the low level to the high level).

It should additionally be appreciated that the control signal (or asynchronous reset signal) 532 is output by the PCU 406 at least partly in response to the latch acknowledgement signal 530 received by the PCU. More particularly, the PCU 406 changes the switching status of the control signal 532 (in this example, the transition from a high level to a low level at the seventh time 536) at least partly in response to the change in switching status of the latch acknowledgement signal 530 (in this example, the transition from a low level to a high level at the sixth time 534). Further, it should additionally be appreciated that the first and second input buffer enable signals 510 and 512 are output by the switchable domain unit 416 in response to the switchable domain unit 416 receiving the control signal (or asynchronous reset signal) 532. More particularly, the switching domain unit 416 changes the switching status of each of the first and second buffer enable signals 510 and 512 (from respective high levels to respective low levels at the second time 514 and third time 516, respectively) at least partly in response to the change in the switching status of the control signal 532 (from the high level to the low level at the seventh time 536).

Accordingly, it should further be appreciated that, in the present embodiment, the seventh time 536 at which the control signal (or asynchronous reset signal) 532 switches from the high level to a low level occurs after the sixth time 534 at which the latch acknowledgement signal 530 switches from the low level to the high level. Further, the second and third times 514 and 516 respectively at which the first and second input buffer enable signals 510 and 512 respectively switch from high to low levels each occur after the seventh time at which the control signal (or asynchronous reset signal) 532 switches from the high level to a low level. Correspondingly, the second and third times 514 and 516 respectively at which the first and second input buffer enable signals 510 and 512 respectively switch from high to low levels each occur only after the sixth time 534 at which the latch acknowledgement signal 530 switches from the low level to the high level. Given this to be the case, and given that the sixth time 534 at which the latch acknowledgement signal 530 switches from the low level to the high level occurs after each of the fourth time 526 and fifth time 528 as discussed above, the second and third times 514 and 516 at which the first and second input buffer enable signals 510 and 512 respectively switch from high to low levels occur only after each of the fourth time 526 and fifth time 528 as well.

From this, it should be recognized that all of the times at which all of the different input buffer enable signals 452 (including the first and second input buffer enable signals 510 and 512) switch from high to low levels occur only after all of the times at which all of the IO pad signals 442 and 444 cause the IO pads 430 to be latched. Accordingly, all of the IO pads 430 are latched to have high statuses before the transitioning of the input buffer enable signals 452 from the high to low levels, insofar as all of the IO pads are latched to have the high level statuses of the respective input buffer enable signals that exist prior to when those input buffer enable signals transition from the high to low levels. Given this manner of operation, it should be appreciated that the SoC integrated circuit 400 avoids experiencing wakeup failures as might otherwise occur during operation of the SoC integrated circuit 200 described above. Because (a) the input buffer enable signals 452 only switch from high states to low states (or to depowered or low power states) at times after the latch acknowledgement signal 456 has been generated and correspondingly after all of the IO pads 430 have been latched in high states (corresponding to the states of the input buffer enable signals when the IO pads are latched), all of the IO pads 430 are indeed latched in high states even though the SoC integrated circuit 400 enters the standby mode. With this being the case, when the SoC integrated circuit 400 is in standby mode, and particularly the core circuitry 402 is in a depowered or low power mode, external signals received by any of the IO pads 430 (e.g., by way of the pins 432, 434, 436, etc. associated therewith) are still communicated as the wakeup signals 454 for receipt by the core circuitry 402.

Figure 6:
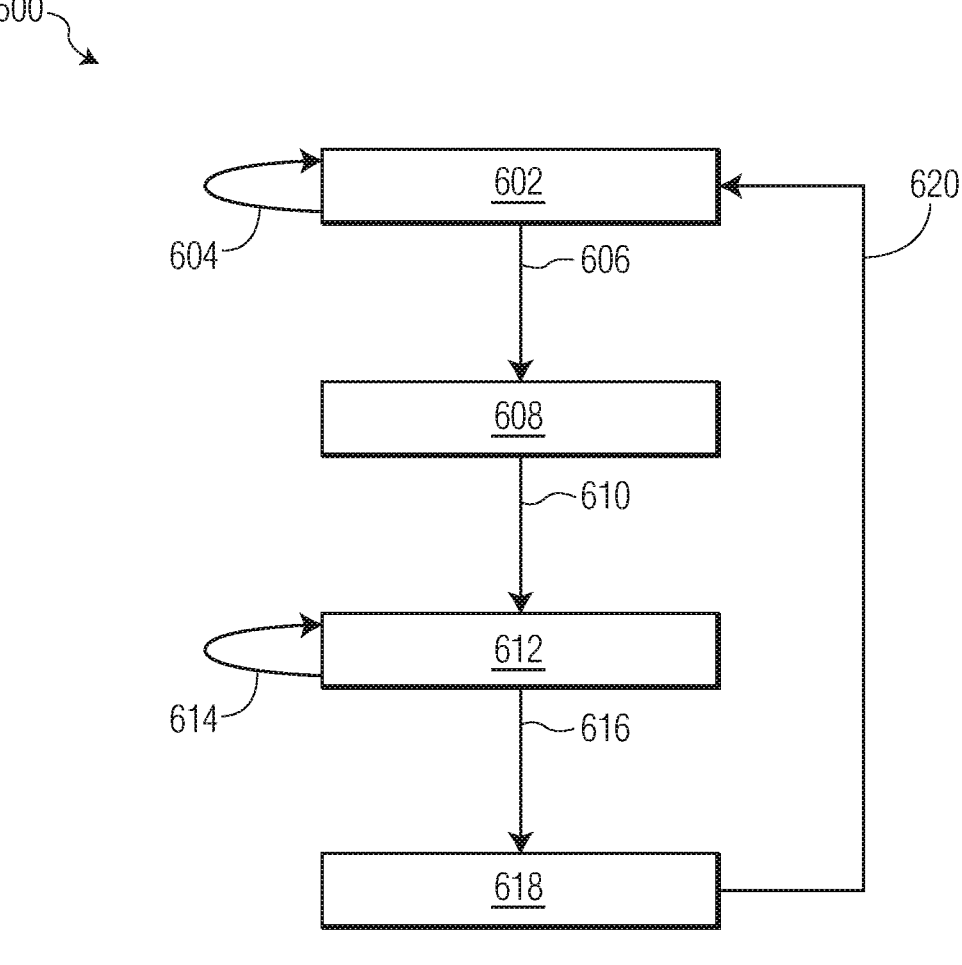
FIG. 6 is a state diagram further illustrating an improved manner of operation of the improved SoC integrated circuit of FIG. 4, and particularly a power control unit (PCU) thereof, in which the improved SoC integrated circuit avoids wakeup failures.

Turning to FIG. 6, a state diagram 600 is provided to illustrate an example state machine flow (or corresponding method of operation) of the SoC integrated circuit 400 and particularly the PCU 406 of the core circuitry 402 thereof. The state diagram 600 particularly concerns a PCU state machine flow of operation that includes handshake functionality, As illustrated, a first state 602 of the state diagram 600 is one in which the SoC integrated circuit 400, and particularly the PCU 406 thereof, is operating in an IDLE/RUN mode in which (among other functions) the PCU waits for a standby entry request. As represented by an arrow (or edge) 604, if no standby request is received, then the PCU 406 remains in the IDLE/RUN mode. However, as represented by an arrow (or edge 606), if a standby request is received, then the PCU 406 advances to a second state 608. At the second state, given that a standby request has been received, then the PCU 406 operates to assert an isolation request to the IORING circuitry 404 by sending a standby signal (for example, corresponding to the standby signal 440 or standby signal 502 described above) for receipt by the SPCR cell 420.

Upon the isolation request being asserted, as illustrated by an arrow 610, the PCU 406 then enters a third state 612 in which the PCU operates in a WAIT mode, and particularly awaits a latch acknowledgement signal (a "LATCH ACK" signal such as the signal 456 or 530) to be received back from the latch acknowledge generation cell 428 of the IORING circuitry 404. The length of time in which the PCU 406 may operate in the WAIT mode may depending upon the embodiment or circumstance, but does (at least in part) reflect the time required to communicate the standby signal (again, for example, the standby signal 440 or 502) from the PCU 406 to the SPCR cell 420, for the generation and sending of the first and second IO signals (for example, the IO signals 440 and 442) to the IO pads 430 and latch acknowledge generation cell 430 428 by the SPCR cell, and for the generation and sending back to the PCU 406 the latch acknowledgement signal (again, for example, the LATCH ACK signal 456 or 530) by the latch acknowledge generation cell 428. During this time in which the PCU 406 is in the WAIT mode, all of the IO pads 430 will be latched with respect their respective controls so that those IO pads may still receive and communicate wakeup signals received from external sources.

So long as no latch acknowledgement signal is received at the PCU 406 when the PCU is in the WAIT mode, the PCU continues to remain in the WAIT mode, as represented by an arrow (or edge) 614. However, upon the PCU 406 receiving a latch acknowledgement signal from the lack acknowledge generation cell 428, as represented by an arrow (or edge) 616, the PCU enters a fourth state 618 in which the PCU 406 causes the asynchronous reset block 412 to sends a control or asynchronous reset ("Async reset") signal for receipt by the switchable domain unit 416 (and the SoC logic unit or IO control unit 418 thereof), which in turn causes the input buffer enable signals 452 to be sent to the IO pad controls so that the IO pad controls are reset. Because the IO pads 430 will have already been latched with respect to their respective controls prior to the input buffer enable signals 452 being sent, the latched status of the IO pads 430 will not change in response to the IO pad controls being reset. As this occurs and afterwards, the PCU 406 (and the SoC integrated circuit 400 overall) may be considered to have entered the standby mode of operation. Given this to be the case, the fourth state 618 may be considered also to consider operation of the PCU 406 in the standby mode. Further, as illustrated by an arrow (or edge) 620, upon entering the standby mode, the PCU remains in the standby mode indefinitely unless a wakeup signal (for example, one of the signals 454) is received via one of the IO pads 430 (e.g., from an external source) or some other event occurs that causes the PCU to switch from the standby mode of the fourth state 618 back to the IDLE/RUN mode of the first state 602.

It should be appreciated that the present disclosure encompasses a variety of embodiments of SoC integrated circuits, including a variety of embodiments having a variety of different arrangements and/or numbers of components such as the components of the core circuitry and/or the components of the IORING circuitry. For example, the present disclosure is intended to encompass any of a variety of SoC integrated circuits having any arbitrary number of IO pads, any arbitrary number of SPCR cells, and/or any arbitrary number of latch acknowledge generation cells, and any of a variety of SoC integrated circuits in which such IO pad(s), SPCR cell(s), latch acknowledge generation cell(s), and/or other component(s) are physically positioned, spaced, or otherwise arranged relative to one another and/or with respect to other portions of the SoC integrated circuits in any of a variety of manners.

Figure 7:
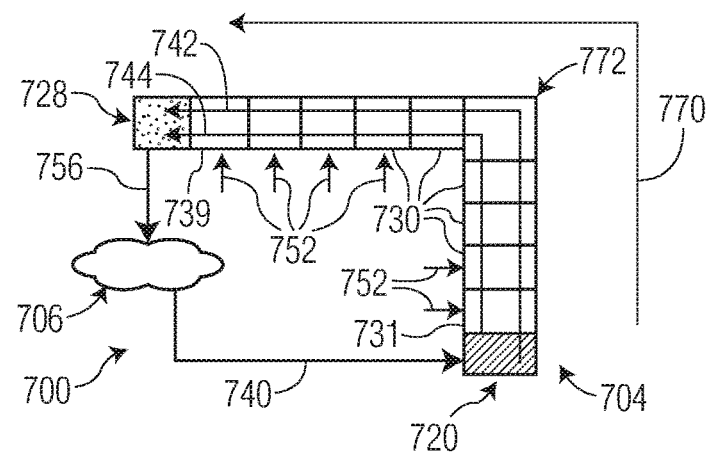
FIG. 7 is an additional schematic diagram illustrating portions of an improved SoC integrated circuit in accordance with a second example embodiment encompassed herein.
Figure 8:
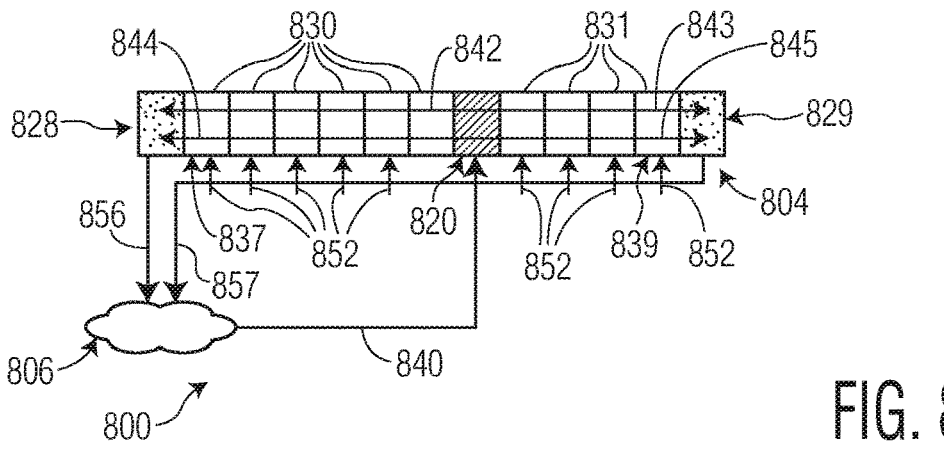
FIG. 8 is an additional schematic diagram illustrating portions of an improved SoC integrated circuit in accordance with a third example embodiment encompassed herein.
Figure 9:
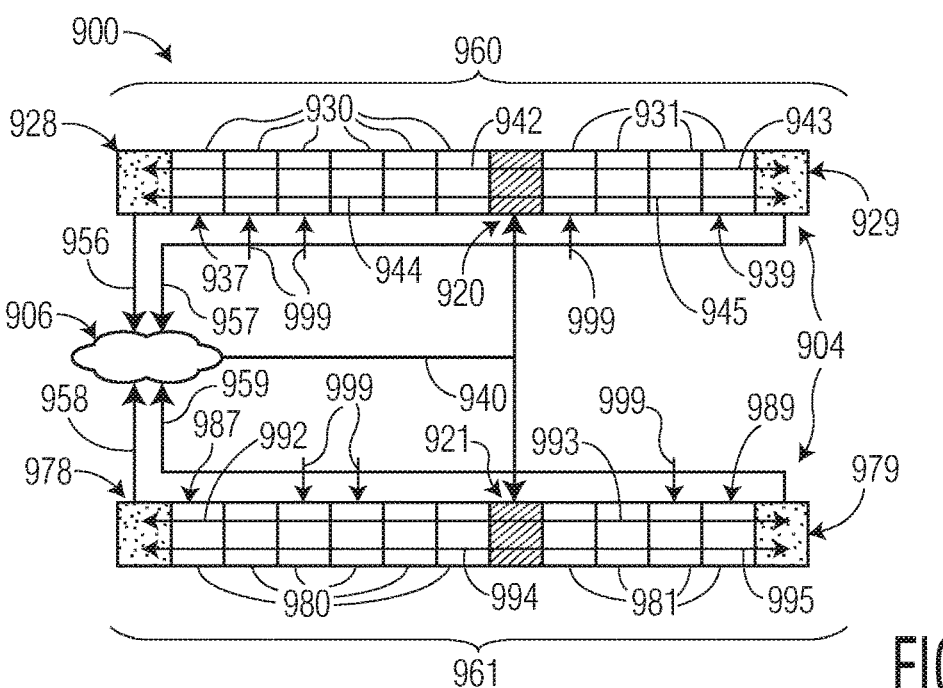
FIG. 9 is an additional schematic diagram illustrating portions of an improved SoC integrated circuit in accordance with a fourth example embodiment encompassed herein.

Further in this regard, FIG. 7, FIG. 8, and FIG. 9 respectively provide additional schematic diagrams illustrating respective portions of improved SoC integrated circuits 700, 800, and 900, respectively, in accordance with second, third, and fourth example embodiments, respectively. It should be appreciated from a comparison of FIG. 7, FIG. 8, and FIG. 9 with FIG. 4 that various portions of the SoC integrated circuits 700, 800, and 900 that will be present when implemented (including certain portions shown in the illustration of FIG. 4 regarding the SoC integrated circuit 400, such as certain additional portions of the core circuitry) are omitted from FIG. 7, FIG. 8, and FIG. 9 in order to simplify the illustrations. In particular, with respect to the core circuitry of the SoC integrated circuits 700, 800, and 900, only PCUs 706, 806, and 906, respectively, are shown, and other components such as asynchronous reset units and switching domain units are omitted to simplify the respective illustrations. Although not shown, it should be appreciated that components corresponding to the asynchronous reset block 412, switchable domain unit 416, and power management control circuit 408 of FIG. 4 will be present within the SoC integrated circuits 700, 800, and 900 when implemented in practice. FIG. 7, FIG. 8, and FIG. 9 particularly are presented to illustrate three different arrangements of IORING circuitry having different numbers and physical arrangements of components, namely, IORING circuitry 704, 804, and 904, respectively, in addition to the respective PCUs 706, 806, and 906 of the respective SoC integrated circuits 700, 800, and 900, respectively. In FIG. 7 it may be seen that the IORING circuitry 704 includes a SPCR (or SPCR abt) cell 720, a latch acknowledge generation cell 728, and a plurality of IO pads 730 positioned in sequence, one after another, between the SPCR cell and the latch acknowledge generation cell. In this example, the plurality of IO pads 730 includes nine of the IO pads, including a first IO pad 731 that is positioned so as to abut the SPCR cell 720 and a final IO pad 739 that is positioned so as to abut the latch acknowledge generation cell 728. As illustrated, the SPCR cell 720 is again configured to receive a standby signal 740 (at least indirectly) from the PCU 706, and is configured to generate and send a first plurality of IO pad signals 742 and a second plurality of IO pad signals 744 for receipt by the IO pads 730 and the latch acknowledge generation cell 728. Additionally, as described above with respect to FIG. 4, the present disclosure encompasses numerous different embodiments in which the IO pad signals communicated among the SPCR cell 720, IO pads 730, and latch acknowledge generation cell 728 take a variety of different forms, including embodiments in which the IO pad signals include one or other of, but not both of, the first plurality of IO pad signals 742 and the second plurality of IO pad signals 744.

In the same (or substantially the same) manner described in regard to the SoC integrated circuit 400 of FIG. 4, the latch acknowledge generation cell 728 of the SoC integrated circuit 700 is configured to generate and send, for receipt by the PCU 706, a latch acknowledgement signal 756 in response to receiving ones of the IO pad signals 742 and 744. Further, in response to receiving the latch acknowledgement signal 756, the PCU 706 is configured to send, or cause the sending of (at least indirectly, such as by the asynchronous reset block and switchable domain unit), input buffer enable signals 752 for receipt by the IO pads 730 or associated controls. As described above in regard to FIG. 4, because the input buffer enable signals are provided (or switch states) only after the latch acknowledgement signal 756 has been generated and correspondingly after all of the IO pads 730 have been latched in high states, all of the IO pads 730 are indeed latched in high states even though the SoC integrated circuit 700 enters the standby mode. With this being the case, when the SoC integrated circuit 700 is in standby mode, and particularly the core circuitry thereof is in a depowered or low power mode, external signals received by any of the IO pads 730 (e.g., by way of the pins associated therewith, not shown) are still communicated as the wakeup signals for receipt by the core circuitry, so that the wakeup signals may cause the SoC integrated circuit to be woken up.

In contrast to the SoC integrated circuit 400 of FIG. 4, however, it should be appreciated that the IORING circuitry 704 of the SoC integrated circuit 700 of FIG. 7 is arranged in an L-shaped manner, along an L-shaped path 770, rather than merely in a straight line. That is, in the present embodiment, the first four of the IO pads 730 (starting with the first IO pad 731) are positioned successively away from the SPCR cell 720 in a first direction toward a corner region 772 and then the remaining five of the IO pads 730 (ending with the final IO pad 739) generally extend away from the corner region toward the latch acknowledge generation cell 728 in a direction that is perpendicular to the direction along which the first four IO pads were successively arranged.

Notwithstanding the particular L-shaped arrangement of the IORING circuitry 704 shown in FIG. 7, it should be appreciated that the present disclosure encompasses other embodiments having IORING circuitry (particularly a series of IO pads positioned between a SPCR cell and a latch acknowledge generation cell) that is arranged in other non-linear manners including, further for example, embodiments in which the IORING circuitry is arranged in a C-shaped manner or a curved manner in which all of the components of the IORING circuitry are generally arranged within or along a single plane. Additionally, the present disclosure also encompasses embodiments in which the IORING circuitry of a SoC integrated circuit, rather than being arranged so as to extend along path(s) generally along one or two dimensions within a single plane, is arranged so as to extend along path(s) along each of three dimensions.

It will be appreciated from the above description that each of the IORING circuitry 404 of the SoC integrated circuit 400 and the IORING circuitry 704 of the SoC integrated circuit 700 includes a single respective SPCR cell, a single respective latch acknowledge generation cell, and a single respective plurality (or series) of IO pads that are positioned successively or sequentially between the respective SPCR cell and respective latch acknowledge generation cell. Nevertheless, the present disclosure also encompasses alternate embodiments in which there are multiple SPCR cells, multiple latch acknowledge generation cells, and/or multiple pluralities of IO pads that are respectively positioned successively or sequentially between different respective SPCR cell(s) and/or latch acknowledgement generation cells. FIG. 8 provides one example of such an alternate embodiment, in which the IORING circuitry 804 of the SoC integrated circuit 800 includes, in addition to a single SPCR cell 820, also first and second latch acknowledge generation cell 828 and 829, respectively, and a first plurality of IO pads 830 and a second plurality of IO pads 831.

In this example embodiment, the first plurality of IO pads 830 includes six IO pads that are positioned in sequence, one after another, between the SPCR cell 820 and the first latch acknowledge generation cell 828, and the second plurality of IO pads 831 includes four IO pads that are positioned in sequence, one after another, between the SPCR cell 820 and the second latch acknowledge generation cell 829. Although not necessarily the case in all embodiments, all of the SPCR cell 820, the IO pads of the first plurality of IO pads 830 and of the second plurality of IO pads 831, and the first and second latch acknowledge generation cells 828 and 829 are aligned along a common linear axis, with the first plurality of IO pads 830 extending outward from the SPCR cell 820 toward the first latch acknowledge generation cell 828 in a first direction that is diametrically opposite to a second direction in which the second plurality of IO pads 831 extend outward from the SPCR cell toward the second latch acknowledge generation cell 829.

It should be appreciated that the numbers of IO pads in the first plurality of IO pads 830 and the second plurality of IO pads 831 may vary depending upon the embodiment and may include any arbitrary number of IO pads, rather than particularly six or particularly four IO pads as shown in FIG. 8. Nevertheless, insofar as the first plurality of IO pads 830 includes a larger number of IO pads than the second plurality of IO pads 831 (and insofar as all of the IO pads are of the same or substantially the same size), it will be additionally appreciated that, in the present embodiment a first final IO pad 837 of the first plurality of IO pads 830 is positioned farther away from the SPCR cell 820 than a second final IO pad 839 of the second plurality of IO pads 831 is positioned away from the SPCR cell 820. Correspondingly, the first latch acknowledge generation cell 828 is positioned farther away from the SPCR cell 820 than the second latch acknowledge generation cell 829 is positioned away from the SPCR cell.

Further with respect to the SoC integrated circuit 800, the SPCR cell 820 is again configured to receive a standby (or latch mode enable control signal) signal 840 from the PCU 806 (at least indirectly). In this embodiment, the SPCR 820 is configured to generate and send, for receipt by the first plurality of IO pads 830 and the first latch acknowledge generation cell 828, a first plurality of IO pad signals 842 and a second plurality of IO pad signals 844, and additionally is configured to generate and send, for receipt by the second plurality of IO pads 831 and the second latch acknowledge generation cell 829, a third plurality of IO pad signals 843 and a fourth plurality of IO pad signals 845. Additionally, as described above with respect to FIG. 4, the present disclosure encompasses numerous different embodiments in which the IO pad signals communicated among the SPCR cell 820, the IO pads 830 and 831, and the latch acknowledge generation cells 828 and 829 take a variety of different forms, including embodiments in which the IO pad signals include one or the other of, but not both of, the first plurality of IO pad signals 842 and the second plurality of IO pad signals 844, and/or in which the IO pad signals include one or the other of, but not both of, the third plurality of IO pad signals 843 and the fourth plurality of IO pad signals 845.

In the same (or substantially the same) manner described in regard to the SoC integrated circuit 400 of FIG. 4, the first latch acknowledge generation cell 828 of the SoC integrated circuit 800 is configured to generate and send, for receipt by the PCU 806, a latch acknowledgement signal 856 in response to receiving ones of the IO pad signals 842 and 844. Also, the second latch acknowledge generation cell 829 of the SoC integrated circuit 800 is configured to generate and send, for receipt by the PCU 806, a latch acknowledgement signal 857 in response to receiving ones of the IO pad signals 843 and 845. Further, in response to receiving both of the latch acknowledgement signals 856 and 857, the PCU 806 is configured to send, or cause the sending of (at least indirectly, such as by the asynchronous reset block and switchable domain unit), input buffer enable signals 852 for receipt by the IO pads 830 and 831 or associated controls.

In the present embodiment, the PCU 806 is configured to send, or cause the sending of, the input buffer enable signals 852 only after both of the latch acknowledgement signals 856 and 857 have been received. Because the input buffer enable signals are provided (or switch states) only in this manner, after both of the latch acknowledgement signals 856 and 857 have been generated and correspondingly after all of the IO pads 830 and 831 have been latched in high states, all of the IO pads 830 and 831 are indeed latched in high states even though the SoC integrated circuit 800 enters the standby mode. With this being the case, when the SoC integrated circuit 800 is in standby mode, and particularly the core circuitry thereof is in a depowered or low power mode, external signals received by any of the IO pads 830 or any of the IO pads 831 (e.g., by way of the pins associated with any of those IO pads) are still communicated as the wakeup signals for receipt by the core circuitry, so that the wakeup signals may cause the SoC integrated circuit to be woken up.

In addition to the example alternate embodiment shown in FIG. 8, FIG. 9 illustrates a further example alternate embodiment in the form of the SoC integrated circuit 900 in which there are multiple SPCR cells, multiple latch acknowledge generation cells, and multiple pluralities of IO pads. More particularly as shown in FIG. 9, the IORING circuitry 904 of the SoC integrated circuit 800 includes first and second SPCR cells 920 and 921, respectively, first, second, third, and fourth latch acknowledge generation cells 928, 929, 978, and 979, respectively, as well as first, second, third, and fourth pluralities of IO pads 930, 931, 980, and 981, respectively.

In this example embodiment, the first SPCR cell 920, first and second latch acknowledge generation cells 928 and 929, and first and second pluralities of IO pads 930 and 931 form a first IORING circuit portion (or VDDA segment) 960 that is identical or substantially identical in layout to the IOR- ING circuitry 804 of the SoC integrated circuit 800. That is, the first plurality of IO pads 930 includes six IO pads that are positioned in sequence, one after another, between the first SPCR cell 920 and the first latch acknowledge generation cell 928, and the second plurality of IO pads 931 includes four IO pads that are positioned in sequence, one after another, between the first SPCR cell 920 and the second latch acknowledge generation cell 929. Again, in this embodiment, all of the first SPCR cell 920, the IO pads of the first plurality of IO pads 930 and of the second plurality of IO pads 931, and the first and second latch acknowledge generation cells 928 and 929 are aligned along a common axis, with the first plurality of IO pads 930 extending outward from the first SPCR cell 920 toward the first latch acknowledge generation cell 928 in a first direction that is diametrically opposite to a second direction in which the second plurality of IO pads 931 extend outward from the SPCR cell toward the second latch acknowledge generation cell 929. Again, in the present embodiment a first final IO pad 937 of the first plurality of IO pads 930 is positioned farther away from the first SPCR cell 920 than a second final IO pad 939 of the second plurality of IO pads 931 is positioned away from the first SPCR cell 920. Correspondingly, the first latch acknowledge generation cell 928 is positioned farther away from the first SPCR cell 920 than the second latch acknowledge generation cell 929 is positioned away from the first SPCR cell.

Additionally in this example embodiment, the second SPCR cell 921, third and fourth latch acknowledge generation cells 978 and 979, and third and fourth pluralities of IO pads 980 and 981 form a second IORING circuit portion (or VDDA segment) 961 that is identical or substantially identical in layout to the IORING circuitry 804 of the SoC integrated circuit 800 (and thus to the first IORING circuit portion 960 of the SoC integrated circuit 900). That is, the third plurality of IO pads 980 includes six IO pads that are positioned in sequence, one after another, between the second SPCR cell 921 and the third latch acknowledge generation cell 978, and the fourth plurality of IO pads 981 includes four IO pads that are positioned in sequence, one after another, between the second SPCR cell 921 and the fourth latch acknowledge generation cell 979. Again, in this embodiment, all of the second SPCR cell 921, the IO pads of the third plurality of IO pads 980 and of the fourth plurality of IO pads 981, and the third and fourth latch acknowledge generation cells 978 and 979 are aligned along a common axis, with the third plurality of IO pads 980 extending outward from the second SPCR cell 921 toward the third latch acknowledge generation cell 978 in a first direction that is diametrically opposite to a second direction in which the fourth plurality of IO pads 981 extend outward from the second SPCR cell 921 toward the fourth latch acknowledge generation cell 979. Again, in the present embodiment a third final IO pad 987 of the third plurality of IO pads 980 is positioned farther away from the second SPCR cell 921 than a fourth final IO pad 989 of the fourth plurality of IO pads 981 is positioned away from the second SPCR cell 921. Correspondingly, the third latch acknowledge generation cell 978 is positioned farther away from the second SPCR cell 921 than the fourth latch acknowledge generation cell 979 is positioned away from the second SPCR cell.

Further with respect to the SoC integrated circuit 900, the SPCR cells 920 and 921 are again configured to receive a standby (or latch mode enable control signal) signal 940 from the PCU 906 (at least indirectly). In this embodiment, the first SPCR 920 is configured to generate and send, for receipt by the first plurality of IO pads 930 and the first latch acknowledge generation cell 928, a first plurality of IO pad signals 942 and a second plurality of IO pad signals 944, and additionally is configured to generate and send, for receipt by the second plurality of IO pads 931 and the second latch acknowledge generation cell 929, a third plurality of IO pad signals 943 and a fourth plurality of IO pad signals 945. Correspondingly, the second SPCR 921 is configured to generate and send, for receipt by the third plurality of IO pads 980 and the third latch acknowledge generation cell 978, a fifth plurality of IO pad signals 992 and a sixth plurality of IO pad signals 994, and additionally is configured to generate and send, for receipt by the fourth plurality of IO pads 981 and the fourth latch acknowledge generation cell 979, a seventh plurality of IO pad signals 993 and an eighth plurality of IO pad signals 995. As described above with respect to FIG. 4, the present disclosure encompasses numerous different embodiments in which the IO pad signals communicated among the SPCR cell 920, the IO pads 930 and 931, and the latch acknowledge generation cells 928 and 929 take a variety of different forms, including embodiments in which the IO pad signals include one or the other of, but not both of, the first plurality of IO pad signals 942 and the second plurality of IO pad signals 944, and/or in which the IO pad signals include one or the other of, but not both of, the third plurality of IO pad signals 943 and the fourth plurality of IO pad signals 945. Likewise, the present disclosure encompasses numerous different embodiments in which the IO pad signals communicated among the SPCR cell 921, the IO pads 980 and 981, and the latch acknowledge generation cells 978 and 979 take a variety of different forms, including embodiments in which the IO pad signals include one or the other of, but not both of, the fifth plurality of IO pad signals 992 and the sixth plurality of IO pad signals 994, and/or in which the IO pad signals include one or the other of, but not both of, the seventh plurality of IO pad signals 993 and the eighth plurality of IO pad signals 995.

In the same (or substantially the same) manner described in regard to the SoC integrated circuit 400 of FIG. 4, the first latch acknowledge generation cell 928 of the SoC integrated circuit 900 is configured to generate and send, for receipt by the PCU 906, a latch acknowledgement signal 956 in response to receiving ones of the IO pad signals 942 and 944. Also, the second latch acknowledge generation cell 929 of the SoC integrated circuit 900 is configured to generate and send, for receipt by the PCU 906, a latch acknowledgement signal 957 in response to receiving ones of the IO pad signals 943 and 945. Likewise, the third latch acknowledge generation cell 978 of the SoC integrated circuit 900 is configured to generate and send, for receipt by the PCU 906, a latch acknowledgement signal 958 in response to receiving ones of the IO pad signals 992 and 994. Also, the fourth latch acknowledge generation cell 979 of the SoC integrated circuit 900 is configured to generate and send, for receipt by the PCU 906, a latch acknowledgement signal 959 in response to receiving ones of the IO pad signals 993 and 995.

Further, in response to receiving all of the latch acknowledgement signals 956, 957, 958, and 959, the PCU 906 is configured to send, or cause the sending of (at least indirectly, such as by the asynchronous reset block and switchable domain unit), input buffer enable signals 999 for receipt by the IO pads 930, 931, 980, and 981 or associated controls. To simplify the illustration provided by FIG. 9, only a few of the input buffer enable signals 999 are labeled, albeit it should be appreciated that input buffer enable signals are provided to each of the IO pads of the first, second, third, and fourth pluralities of IO pads 930, 931, 980, and 981, or associated controls. In the present embodiment, the PCU 906 is configured to send, or cause the sending of, the input buffer enable signals 999 only after all of the latch acknowledgement signals 956, 957, 958, and 959 have been received. Because the input buffer enable signals are provided (or switch states) only in this manner, after all of the latch acknowledgement signals 956, 957, 958, and 959 have been generated and correspondingly after all of the IO pads 930, 931, 980, and 981 have been latched in high states, all of the IO pads 930, 931, 980, and 981 are indeed latched in high states even though the SoC integrated circuit 900 enters the standby mode. With this being the case, when the SoC integrated circuit 900 is in standby mode, and particularly the core circuitry thereof is in a depowered or low power mode, external signals received by any of the IO pads 930, any of the IO pads 931, any of the IO pads 980, or any of the IO pads 981 (e.g., by way of the pins associated with any of those IO pads) are still communicated as the wakeup signals for receipt by the core circuitry, so that the wakeup signals may cause the SoC integrated circuit to be woken up.

In view of the above description, it should be appreciated that the present disclosure encompasses a variety of embodiments and applications, and the concepts described herein are scalable for multiple segments (e.g., IORING segments or VDDA segments) and/or power mode options. The present disclosure encompasses solutions that may scale up (or may be scaled up) for any number of power domains or segments in the pad-ring (that is, when a portion of a pad-ring with its pads is to be retained when the SoC core logic power domain(s) is or are powered down). Additionally, notwithstanding description herein regarding embodiments in which input buffer enable (IBE) signals (e.g., the IBE signals 452, 752, 852, and 999) particularly are sent after or in response to latch acknowledgement (or feedback) signals are communicated, the present disclosure also encompasses additional embodiments in which one or more other types of IO pad enable/control signals in addition to or instead of IBE signals are sent after or in response to the communication of latch acknowledgement signals—for example, OBE signals, PUE signals, and/or PUS signals (in addition to or instead of IBE signals). Also, the present disclosure encompasses a variety of embodiments of methods and systems in which the methods and systems avoid, or facilitate avoiding, wakeup failures or failures during power mode transitions (for example, with respect to IO states during standby or low power mode), including such methods and systems that are feedback based and/or scalable.

Additionally, in at least one example embodiment, the present disclosure relates to a System-on-Chip (SoC) integrated circuit. The SoC integrated circuit includes core circuitry including one or more control components, and peripheral input/output (IO) circuitry. The peripheral IO circuitry includes a first input circuit portion positioned at a first location, and a first plurality of IO pads, where each respective IO pad is positioned at a respective additional location and is coupled at least indirectly with the first input circuit portion, and includes or is associated with a respective terminal. The peripheral IO circuitry also includes a first feedback generation cell positioned at a further location and coupled at least indirectly with the first input circuit portion, where the further location is physically farther from the first location than each of the additional locations. Additionally, the one or more control components is or are configured to send a first standby signal to be received by the first circuit portion. Further, the input circuit portion is configured to send at least indirectly one or more first intermediate signals to be received by the IO pads and the feedback generation cell in response to the standby signal. Also, the feedback generation cell is configured to send at least one first feedback signal to be received by the one or more control components in response to a first one of the one or more intermediate signals. Additionally, the one or more control components is or are additionally configured to send, after the one or more control components have received the at least one first feedback signal, one or more IO pad enable/control signals to be received by the IO pads which are capable of communicating at least one wakeup signal to be received by the core circuitry.

Further, in at least one additional example embodiment, the present disclosure relates to a method of operating a System-on-Chip (SoC) integrated circuit so as to avoid wakeup failures. The method includes receiving, at a power control unit (PCU) of core circuitry of the SoC integrated circuit a standby request, and sending a first standby signal at least indirectly from the PCU to be received by a first input cell of peripheral circuitry of the SoC integrated circuit. The method additionally includes sending one or more first input/output (IO) signals from the first input cell to be received by first IO pads and a first latch acknowledge generation cell of the peripheral circuitry, where the first IO pads are latched in response to the one or more first IO signals. The method further includes sending at least one first latch acknowledgement signal from the first latch acknowledge generation cell to be received by the PCU in response to a first one of the one or more first IO signals being received by the first latch acknowledge generation cell. The method also includes sending a first plurality of IO pad enable/control signals at least indirectly from the core circuitry to be received by first IO pad controls associated with the first IO pads, in response to the core circuitry receiving the at least one first latch acknowledgement signal, where the PCU enters a standby mode upon the IO pad enable/control signals being sent. Further, at least partly because the first IO pads are latched prior to the IO pad enable/control signals being received by the first IO pad controls, the first IO pads retain a first status subsequent to the IO pad enable/control signals being received by the first IO pad controls so that the first IO pads are capable of communicating one or more wakeup signals received at one or more respective terminals associated with the first IO pads to be received by the core circuitry.

Additionally, in at least one further example embodiment, the present disclosure relates to a method of operating a System-on-Chip (SoC) integrated circuit so as to avoid wakeup failures. The method includes sending, in response to a standby signal arriving from core circuitry, input/output (IO) signals from an input cell to be received by IO pads and a feedback signal generation cell of peripheral circuitry, wherein the IO pads respectively are coupled to the input cell by respective first signal paths and the feedback signal generation cell is coupled to the input cell by a further signal path that is longer than each of the first signal paths. Also, the method includes latching the respective IO pads to respective first statuses in response to IO signals. Further, the method includes sending a feedback signal from the feedback signal generation cell to be received by the core circuitry in response to a first one of the IO signals being received by the feedback signal generation cell, wherein the sending of the feedback signal occurs after the latching of the respective IO pads due to the further signal path being longer than the first signal paths. Additionally the method includes sending, in response to the feedback signal, additional signals at least indirectly from the core circuitry to be received by IO pad controls associated with the IO pads, so that the IO pad controls respectively experience changed statuses in response to the additional signals. Further, notwithstanding the respective changed statuses experienced by the IO pad controls, the IO pads retain the first statuses so that the IO pads are capable of communicating at least one wakeup signal to be received by the core circuitry.

One or more of the embodiments encompassed herein may be advantageous in any of a variety of respects. For example, at least some embodiments encompassed herein provide a robust, scalable, placement and routing independent solution to safeguard against wakeup failures from standby, low power mode when using IO pads such as wakeup source. Also for example, at least some embodiments encompassed herein provide a robust feedback-based (or handshake-based) solution between the IORING and SoC sides of an SoC integrated circuit to allow the SoC integrated circuit to avoid wakeup signal failure scenarios. Further for example, at least some embodiments encompassed herein ensure that low voltage IO controls are latched inside the IO before these get reset during standby entry. Additionally for example, at least some embodiments encompassed herein employ a manner of operation involving closed loop feedback (or handshake operation) that may make the SoC integrated circuit design independent of the area/size of the SoC integrated circuit (or core circuitry or SoC circuitry thereof) and/or timing considerations. Indeed, further for example, at least some embodiments encompassed herein achieve SoC integrated circuits that are more robust that conventional embodiments, in terms of avoiding wakeup failures notwithstanding pressure (or process), volume (or voltage), or temperature (PVT) variations and/or increasing sizes of the IORING size, number of IO pads (or of the die of the integrated circuit).

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

We claim:

1. A System-on-Chip (SoC) integrated circuit comprising:
core circuitry including one or more control components; and
peripheral input/output (IO) circuitry including
a first input circuit portion positioned at a first location,
a first plurality of IO pads, wherein each respective IO pad is positioned at a respective additional location and is coupled at least indirectly with the first input circuit portion, and includes or is associated with a respective terminal, and
a first feedback generation cell positioned at a further location and coupled at least indirectly with the first input circuit portion, wherein the further location is physically farther from the first location than each of the additional locations;
wherein the one or more control components is or are configured to send a first standby signal to be received by the first circuit portion,
wherein the input circuit portion is configured to send at least indirectly one or more first intermediate signals to be received by the IO pads and the feedback generation cell in response to the standby signal,
wherein the feedback generation cell is configured to send at least one first feedback signal to be received by the one or more control components in response to a first one of the one or more intermediate signals, and
wherein the one or more control components is or are additionally configured to send, after the one or more control components have received the at least one first feedback signal, one or more IO pad enable/control signals to be received by the IO pads which are capable of communicating at least one wakeup signal to be received by the core circuitry;
wherein the one or more IO pad enable/control signals include one or more input buffer enable (IBE) signals; and
wherein:
when the respective IO pads receive respective ones of the one or more intermediate signals, the respective IO pads are latched so that the respective IO pads may receive and communicate at least one wakeup signal received from one or more external sources;
the feedback generation cell only sends the at least one feedback signal after all of the IO pads have been latched so that the respective IO pads receive and communicate the at least one wake up signal because the further location is further away from the first location than each of the additional locations;
the one or more control components only send the one or more IBE signals to be received by the IO pads after all of the IO pads have been latched so that the respective IO pads receive and communicate the at least one wake up signal, insofar as the one or more control components only send the one or more IBE signals after the one or more control components have received the at least one feedback signal; and
the IO pads remain capable of receiving and communicating the at least one wake up signal after the IBE signals are sent.

2. The SoC integrated circuit of claim 1, wherein the one or more IO pad enable/control signals include one or more output buffer enable (OBE) signals, one or more pull-up-enable (PUE) signals, or one or more pull-up-select (PUS) signals.

3. The SoC integrated circuit of claim 1, wherein the one or more control components include a power control unit (PCU) that is configured to send the standby signal.

4. The SoC integrated circuit of claim 3, wherein the one or more control components include, in addition to the PCU, at least one additional circuit that is coupled at least indirectly to the PCU and that is configured to send the IBE signals, and
wherein the at least one additional circuit includes an asynchronous reset block and a switchable domain unit including a SoC logic unit, the asynchronous reset block being coupled between the PCU and the switchable domain unit.

5. The SoC integrated circuit of claim 3, wherein the one or more control components additionally include a power management control circuit (PMC) that is coupled at least indirectly to the PCU.

6. The SoC integrated circuit of claim 1, wherein the additional locations are located along or proximate to a periphery of the SoC integrated circuit, and wherein the respective additional locations at which are positioned the respective IO pads of the plurality of IO pads are successively positioned physically at respective farther distances from the first location of the input circuit portion in between the first location and the further location.

7. The SoC integrated circuit of claim 1, wherein the respective additional locations at which the respective IO pads of the plurality of IO pads are successively positioned are positioned along an L-shaped path between the first location and the further location.

8. The SoC integrated circuit of claim 1, wherein the peripheral IO circuitry additionally includes a second plurality of IO pads, and a second feedback generation cell, wherein the respective second plurality of IO pads are all positioned physically between the first input circuit portion and the second feedback generation cell.

9. The SoC integrated circuit of claim 8, wherein the first plurality of IO pads extend away from the first input circuit portion in a first direction that is substantially opposite a second direction in which the second plurality of IO pads extend away from a first input cell, wherein the input circuit portion is configured to send at least indirectly one or more second intermediate signals to be received by the IO pads of the second plurality of IO pads and the second feedback generation cell in response to the standby signal, wherein the second feedback generation cell is configured to send at least one second feedback signal to be received by the one or more control components in response to a first one of the one or more second intermediate signals, and wherein the one or more control components is or are further configured to send, after the one or more control components have received the at least one second feedback signal and the at least one first feedback signal, at least one additional IBE signal to be received by the IO pads of the second plurality of IO pads.

10. The SoC integrated circuit of claim 8, wherein the peripheral IO circuitry additionally includes a second input circuit portion, a third plurality of IO pads, a fourth plurality of IO pads, a third feedback generation cell, and a fourth feedback generation cell, wherein the third plurality of IO pads are all positioned physically between the second input circuit portion and the third feedback generation cell, and the fourth plurality of IO pads are al positioned physically between the second input circuit portion and the fourth feedback generation cell.

11. The SoC integrated circuit of claim 10, wherein the first input circuit portion is configured to send at least indirectly one or more second intermediate signals to be received by the IO pads of the second plurality of IO pads and the second feedback generation cell in response to the standby signal, wherein the second input circuit portion is configured to send at least indirectly one or more third intermediate signals to be received by the IO pads of the third plurality of IO pads and the third feedback generation cell in response to either the first standby signal or a second standby signal, wherein the second input circuit portion is configured to send at least indirectly one or more fourth intermediate signals to be received by the IO pads of the fourth plurality of IO pads and the fourth feedback generation cell in response to either the first standby signal or the second standby signal, wherein the second feedback generation cell is configured to send at least one second feedback signal to be received by the one or more control components in response to a first one of the one or more second intermediate signals, wherein the third feedback generation cell is configured to send at least one third feedback signal to be received by the one or more control components in response to a first one of the one or more third intermediate signals, and wherein the fourth feedback generation cell is configured to send at least one fourth feedback signal to be received by the one or more control components in response to a first one of the one or more fourth intermediate signals, and wherein the one or more control components is or are further configured to send, after the one or more control components have received each of the at least one first feedback signal, the at least one second feedback signal, the at least one third feedback signal, and the at least one fourth feedback signal, at least one further IBE signal to be received by the IO pads of the second plurality of IO pads, the third plurality of IO pads, and the fourth plurality of IO pads.

12. A method of operating a System-on-Chip (SoC) integrated circuit so as to avoid wakeup failures, the method comprising:

receiving, at a power control unit (PCU) of core circuitry of the SoC integrated circuit a standby request;

sending a first standby signal at least indirectly from the PCU to be received by a first input cell of peripheral circuitry of the SoC integrated circuit;

sending one or more first input/output (IO) signals from the first input cell to be received by first IO pads and a first latch acknowledge generation cell of the peripheral circuitry, wherein the first IO pads are latched in response to the one or more first IO signals;

sending at least one first latch acknowledgement signal from the first latch acknowledge generation cell to be received by the PCU in response to a first one of the one or more first IO signals being received by the first latch acknowledge generation cell; and sending a first plurality of IO pad enable/control signals at least indirectly from the core circuitry to be received by first IO pad controls associated with the first IO pads, in response to the core circuitry receiving the at least one first latch acknowledgement signal, wherein the PCU enters a standby mode upon the IO pad enable/control signals being sent;

wherein, at least partly because the first IO pads are latched prior to the IO pad enable/control signals being received by the first IO pad controls, the first IO pads retain a first status subsequent to the IO pad enable/control signals being received by the first IO pad controls so that the first IO pads are capable of communicating one or more wakeup signals received at one or more respective terminals associated with the first IO pads to be received by the core circuitry;

wherein the first plurality of IO pad enable/control signals includes a first plurality of input buffer enable (IBE) signals;

wherein, prior to the receiving of the standby request, the PCU is in an idle or run mode, wherein the PCU enters a wait mode when the standby signal is sent and remains in the wait mode until the at least one latch acknowledgement signal is received, wherein the PCU wakes up from the standby mode in response to the one or more wakeup signals being received by the core circuitry, and